(12) United States Patent
Sheperek et al.

(10) Patent No.: US 11,791,004 B2
(45) Date of Patent: Oct. 17, 2023

(54) THRESHOLD VOLTAGE OFFSET BIN SELECTION BASED ON DIE FAMILY IN MEMORY DEVICES

(71) Applicant: Micron Technology, Inc., Boise, ID (US)

(72) Inventors: Michael Sheperek, Longmont, CO (US); Bruce A. Liikanen, Berthoud, CO (US); Steve Kientz, Westminster, CO (US); Anita Ekren, Loveland, CO (US); Gerald Cadloni, Longmont, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/081,004

(22) Filed: Dec. 14, 2022

(65) Prior Publication Data

US 2023/0115960 A1    Apr. 13, 2023

Related U.S. Application Data

(63) Continuation of application No. 17/070,526, filed on Oct. 14, 2020, now Pat. No. 11,545,227.

(51) Int. Cl.
| | |
|---|---|
| *G11C 16/34* | (2006.01) |
| *G11C 16/10* | (2006.01) |
| *G11C 7/04* | (2006.01) |
| *G11C 16/32* | (2006.01) |
| *G11C 16/30* | (2006.01) |
| *G11C 16/26* | (2006.01) |

(52) U.S. Cl.
CPC .............. *G11C 16/349* (2013.01); *G11C 7/04* (2013.01); *G11C 16/10* (2013.01); *G11C 16/26* (2013.01); *G11C 16/30* (2013.01); *G11C 16/32* (2013.01); *G11C 16/3404* (2013.01); *G11C 16/3459* (2013.01)

(58) Field of Classification Search
CPC ......... G11C 16/349; G11C 7/04; G11C 16/10; G11C 16/26; G11C 16/30; G11C 16/32; G11C 16/3404; G11C 16/3459; G11C 16/3418; G11C 16/3422; G11C 29/00; G11C 16/08
See application file for complete search history.

(56) References Cited

U.S. PATENT DOCUMENTS

| 11,270,772 B1* | 3/2022 | Rayaprolu | ............... G11C 7/04 |
| 2008/0168320 A1 | 7/2008 | Cassuto | |
| 2015/0113203 A1 | 4/2015 | Dancho | |

* cited by examiner

*Primary Examiner* — Jay W. Radke
(74) *Attorney, Agent, or Firm* — Lowenstein Sandler LLP

(57) ABSTRACT

A method includes associating, by a processing device, a set of dies of a block family with a die family, wherein the block family is associated with a first threshold voltage offset bin for voltage offsets to be applied in a read operation; and responsive to detecting a triggering event, associating each die of the set of dies with a second threshold voltage offset bin for voltage offsets to be applied in a read operation, wherein the second threshold voltage offset bin is selected based on a representative die of the set of dies associated with the die family.

20 Claims, 12 Drawing Sheets

900

910 Program one or more blocks at a memory device, wherein the one or more blocks are associated with a block family and with a plurality of dice

920 Associate the block family with a first threshold voltage offset bin for each of the plurality of dice

930 Responsive to detecting a triggering event, selecting, for calibrating the block family, a second threshold voltage offset bin based on a first die of the plurality of die, wherein the first die is associated with a first die family

940 calibrating the block family by associating the block family with the second threshold voltage offset bin for each of a first subset of dice of the plurality of dice, wherein the first subset of dice is associated with the first die family

FIG. 9

THRESHOLD VOLTAGE OFFSET BIN SELECTION BASED ON DIE FAMILY IN MEMORY DEVICES

RELATED APPLICATIONS

The present application is a continuation of application Ser. No. 17/070,526, filed Oct. 14, 2020, entitled "THRESHOLD VOLTAGE OFFSET BIN SELECTION BASED ON DIE FAMILY IN MEMORY DEVICES" which is incorporated by reference herein.

TECHNICAL FIELD

Embodiments of the disclosure are generally related to memory sub-systems, and more specifically, related to bin selection based on die family in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of some embodiments of the disclosure.

FIG. 9 is a flow diagram of an example method of threshold voltage offset bin selection based on die family, in accordance with some embodiments of the disclosure.

DETAILED DESCRIPTION

Figure 1:
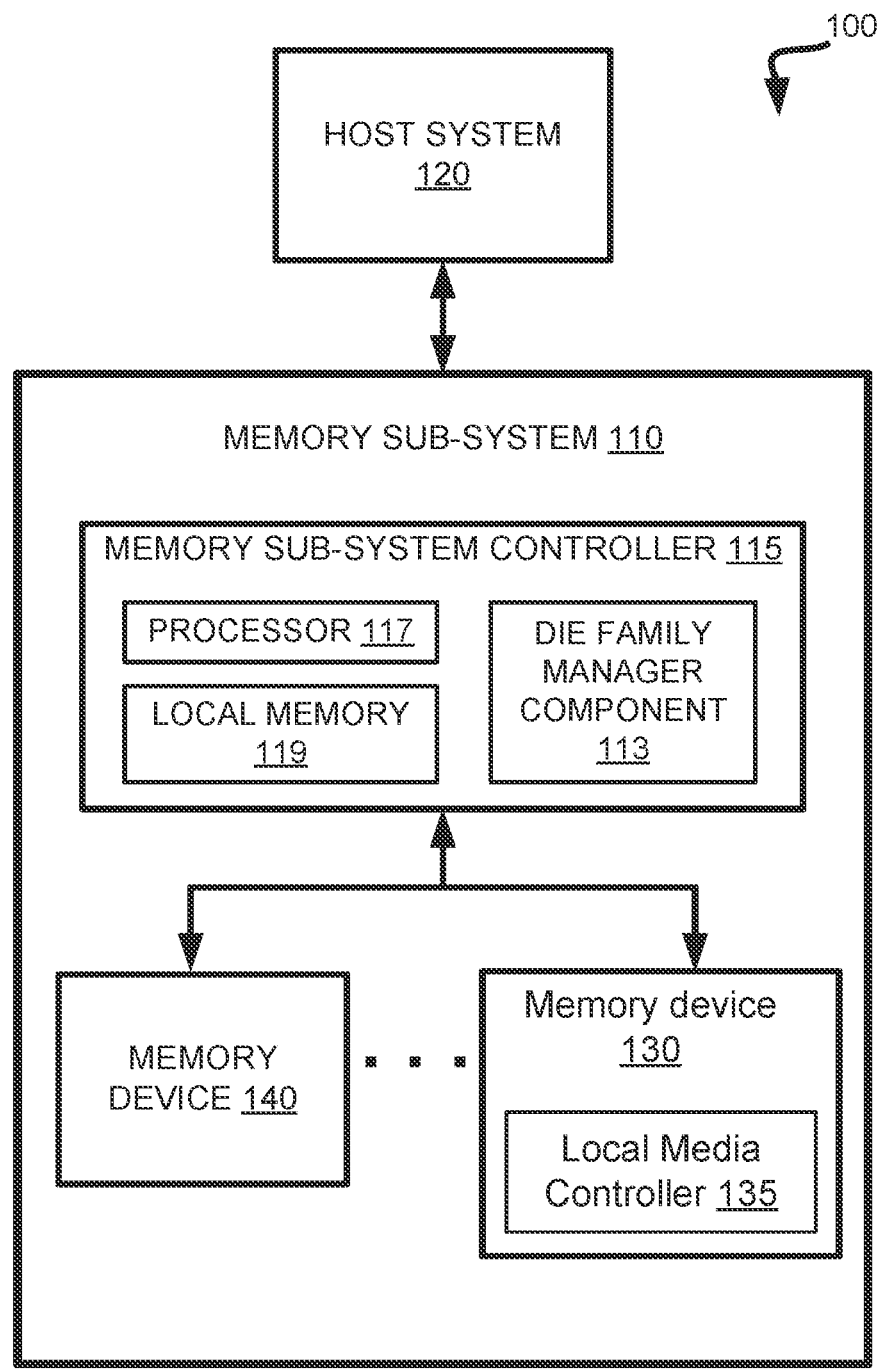
FIG. 1 illustrates an example computing system that includes a memory sub-system, in accordance with some embodiments of the disclosure.

Embodiments of the disclosure are directed to threshold voltage offset bin selection based on die family in memory devices. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more die. Each die can consist of one or more planes. Planes can be groups into logic units (LUN). For some types of non-volatile memory devices (e.g., NAND devices), each plane consists of a set of blocks. A "block" herein refers to a set of contiguous or non-contiguous memory pages. An example of a block is an erasable block, which is a minimal erasable unit of memory, while a page is a minimal writable unit of memory. Each page includes a set of memory cells ("cells"). A cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, hereinafter is referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g., used to distinguish age of data written), valid bitmap (which LBAs or logical transfer units contain valid data), block family information, and the like.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (TVS), since the degrading electric charge causes the voltage distributions to shift along the voltage axis towards lower voltage levels. TVS is the change in the measured voltage of cells as a function of time. The threshold voltage changes rapidly at first (immediately after the memory cell was programmed), and then slows down in an approximately logarithmic linear fashion with respect to the time elapsed since the cell programming event. TVS can include different components such as intrinsic charge loss, system charge loss, quick charge loss, etc. Replacement Gate (RG) NAND generally exhibits more TVS than floating gate NAND. TVS is generally increased by Program Erase Cycles (PEC), higher temperatures, and higher program voltages. TVS shows also significant die-to-die variation. Failure to mitigate the temporal voltage shift caused by the slow charge loss can result in the increased raw bit error rate (or RBER) in read operations.

However, various common implementations either fail to adequately address the temporal voltage shift or employ inefficient strategies resulting in high RBER and/or exhibiting other shortcomings (e.g., computational or storage inefficiencies in implementing the different strategies). Aspects of the disclosure address the above-noted and other deficiencies by implementing a memory sub-system that employs a die family based error avoidance strategies, thus significantly and efficiently improving the bit error rate exhibited by the memory sub-system.

In accordance with embodiments of the disclosure, the temporal voltage shift is selectively tracked for programmed blocks grouped by block families, and appropriate voltage offsets, which are based on block affiliation with a certain block family, are applied to the base read levels in order to perform read operations. "Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family may be made with any granularity, containing only whole codewords, whole pages, whole super pages, or whole superblocks, or any their combinations. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process in order to associate, based on data state metric measurements, each die of every block family with one of the predefined threshold voltage offset bins, which is in turn associated with the voltage offset to be applied for read operations. The associations of blocks with block families and block families and dies with threshold voltage offset bins can be stored in respective metadata tables maintained by the memory sub-system controller.

In order to reduce the number of calibration operations, the memory controller can group the blocks or partitions of the block family into die families. When a block family is created, all blocks of the block family, irrespectively of which die they reside on, are associated with the first voltage bin, and thus all dies are assigned to a single die family. Subsequently, the association of blocks with die families can be modified based on the calibration operations performed on those blocks.

"Die family" herein shall refer to a set of die that exhibit similar temporal voltage shift and therefore have the same threshold voltage offset bin pointers. By definition, having the same voltage bin pointers, all die within a single die family would require the same voltage offsets to be applied to the base read levels for read operations "Data state metric" herein shall refer to a quantity that is measured or inferred from the state of data stored on a memory device. Specifically, the data state metrics may reflect the state of the temporal voltage shift, the degree of read disturb, and/or other measurable functions of the data state. A composite data state metric is a function (e.g., a weighted sum) of a set of component state metrics.

In accordance with embodiments of the present disclosure, the memory sub-system can form a die family corresponding to a time after program (TAP). The die family can include a number of die that behave similarly in terms of temporal voltage shift. The die included in a die family can share one or more similar characteristics. For example, a die in a die family can share various characteristics, such as, slow charge loss, read disturb, data integrity, endurance, operational temperature, dynamic wear, or static wear, with other die in the die family. A measure which quantifies the characteristics associated with the die can be obtained. The measure can be used to group one or more die in a particular die family. In some examples, the measure can be associated with various data state metrics. For example, the measure can be derived from a data state metric. In some examples, the measure can be associated with a temporal voltage shift (TVS), a voltage offset, a threshold voltage offset bin, a raw bit error rate (RBER), a rate of slow charge loss, or a combination thereof. If the memory sub-system determines that the measure associated with a die satisfies a criterion to group a number of die to a die family, the memory sub-system associates the die to the die family. In an example, the measure satisfies a criterion when the measure is within a set of values associated with the die family. Similarly, using the measure associated with each die of the block family, the memory sub-system can determine to associate each die of the block family to a die family whose criterion is satisfied by a respective die.

In some embodiments, subsequent to forming the die families, a calibration process to associate each die family with a predefined read threshold voltage offset bin can be performed periodically. To perform a calibration process, one or more data state metric values reflecting the temporal voltage shift characteristics can be determined for one or more representative die of a die family (e.g., rather than all the die of a block family). The determined temporal voltage shift characteristics of the representative die of the die family can be used to set a modified threshold voltage offset bin for each of the die in the die family.

Therefore, advantages of the systems and methods implemented in accordance with some embodiments of the disclosure include, but are not limited to, improving the bit error rate in read operations by maintaining metadata tracking die families that exhibit similar voltage distributions and selectively performing calibration operations for die families using one or more representative die of each die family, as described in more detail herein below. By eliminating the need for scanning every die during the calibration process, quality of service to host system is increased. Interruptions during host requests are reduced as a result of not scanning every die while a host request is being performed.

FIG. 1 illustrates an example computing system 100 that includes a memory sub-system 110 in accordance with some embodiments of the disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a die family manager component 113 that can be used to implement the die family error avoidance strategies, in accordance with embodiments of the disclosure. In some embodiments, the controller 115 includes at least a portion of the die family manager component 113. For example, the controller 115 can include a processor 117 (processing device) configured to execute instructions stored in local memory 119 for performing the operations described herein. In some embodiments, the die family manager component 113 is part of the host system 120, an application, or an operating system. The die family manager component 113 can manage die families associated with the memory devices 130, as described in more detail herein below.

Figure 2:
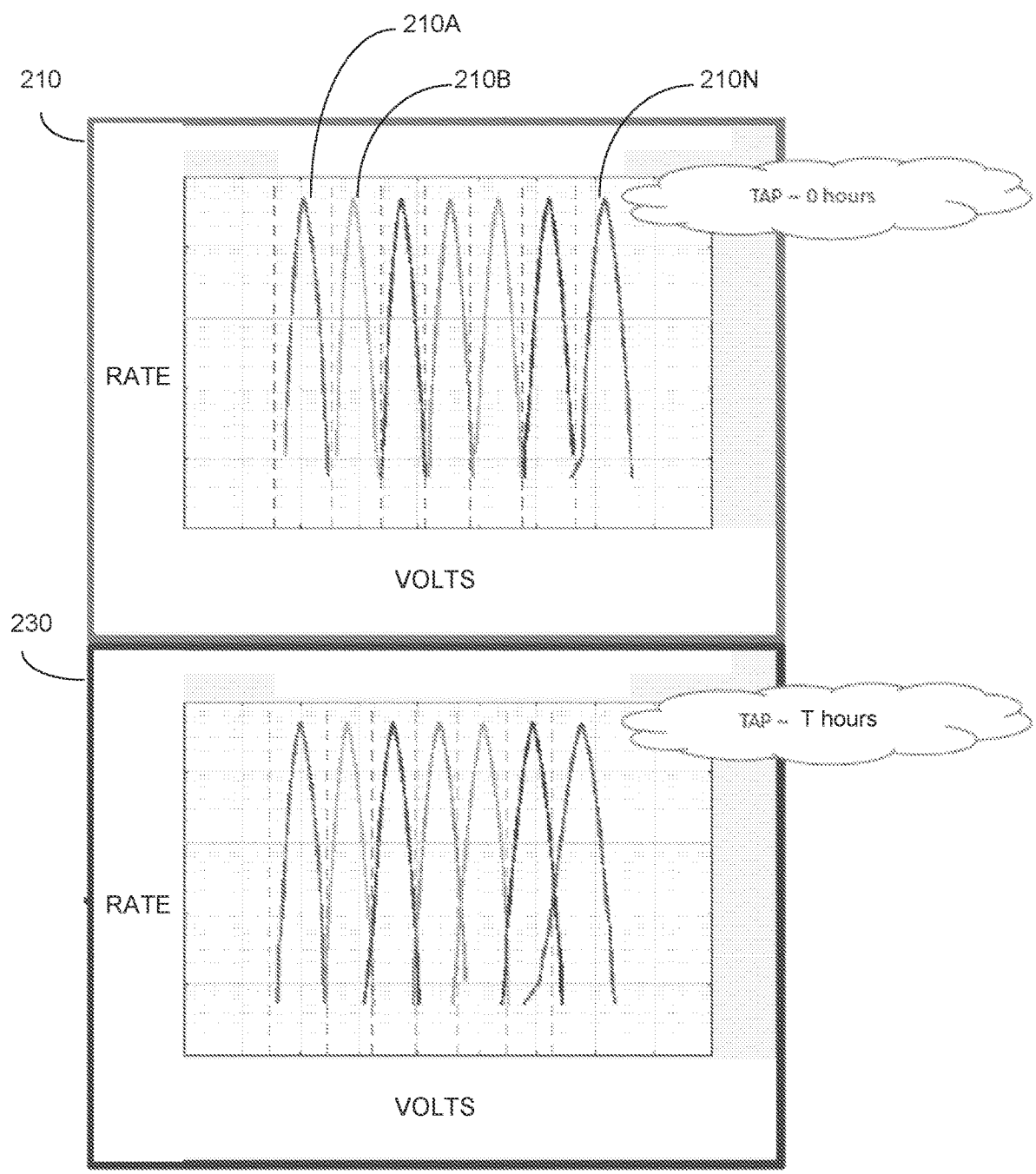
FIG. 2 illustrates the temporal voltage shift caused at least in part by the slow charge loss exhibited by triple-level memory cells, in accordance with embodiments of the disclosure.

FIG. 2 is a set of graphs that illustrate a temporal voltage shift caused by the slow charge loss exhibited by triple-level memory cells, in accordance with some embodiments. While the illustrative example of FIG. 2 utilizes triple-level cells, the same observations can be made and, accordingly, the same remedial measures are applicable to other types of memory cells that can store any number of bits per cell, such as, single level cells (SLC), quad-level cells (QLC), multi-level cells (MLC), etc. in order to compensate for the slow charge loss.

As noted herein above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with 2n different threshold voltage levels is capable of storing n bits of information.

In FIG. 2, each graph illustrates a voltage distribution produced by memory cells programmed by a respective write level (which can be assumed to be at the midpoint of the distribution) to encode a corresponding logical level ("000" through "111" in case of a TLC). In order to distinguish between neighboring distributions (corresponding to two different logical levels), the threshold voltage levels (shown by dashed vertical lines) are defined, such that any measured voltage that falls below a threshold level is associated with one distribution of the pair of neighboring distributions, while any measured voltage that is greater than or equal to the threshold level is associated with another distribution of the pair of neighboring distributions.

The set of a graphs include a first graph 210 that reflects a time period immediately after programming and a second graph 230 that reflects a long time after programming. As seen by comparing the second graph 230 to the first graph 210, the voltage distributions change in time due to the slow charge loss, which results in drifting values of the threshold voltage levels (shown by dashed vertical lines). In various embodiments, this temporal voltage shift (TVS) is selectively tracked for programmed pages or blocks grouped by block families, and appropriate voltage offsets, which are based on page or block affiliation with a certain block family, are applied to the base read levels in order to perform read operations.

Figure 3:
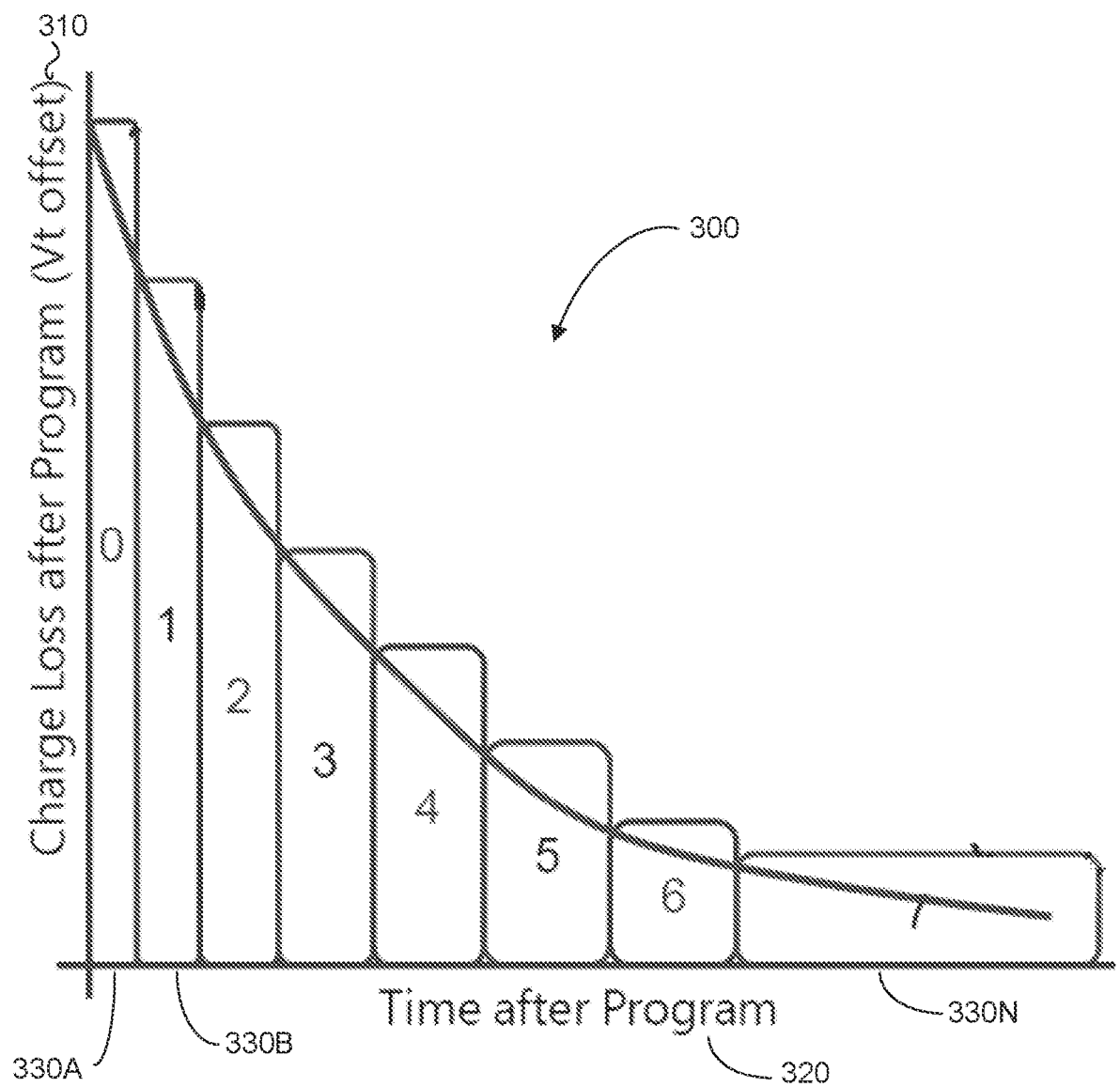
FIG. 3 is an example graph illustrating the dependency of a threshold voltage offset on the time after program, e.g., the time since a cell has been written, in accordance with some embodiments of the disclosure.

FIG. 3 is an example graph 300 illustrating the dependency of a threshold voltage offset 310 on the time after program 320, e.g., the period of time elapsed since a cell has been written (e.g., programmed), in accordance with some embodiments. As schematically illustrated by FIG. 3, pages or blocks (or groups of memory cells at another granularity) of the memory device are grouped into block families 330A-330N, such that each block family includes one or more pages or blocks that have been programmed within a specified time window (or window of time), potentially varied by aggregate temperature and/or PEC while the block family is open. As noted herein above, since the time elapsed after programming and temperature are the main factors affecting the temporal voltage shift, all pages, blocks, and/or partitions within a single block family are presumed to exhibit similar distributions of threshold voltages in memory cells, and thus would require the same voltage offsets for read operations as time passes.

Block families can be created asynchronously with respect to page programming events. In an illustrative example, the memory sub-system controller 115 of FIG. 1 can create a new block family whenever a specified period of time (e.g., a predetermined number of minutes) has elapsed since creation of the last block family, which time period can vary significantly depending on an aggregate temperature and/or PEC associated with pages during programming. More specifically, the entire asymptotic curve illustrated in FIG. 3 can be shifted to have a steeper curve with respect to time as aggregate temperature and/or PEC increases. Slow charge loss is illustrated along the vertical access for the seventh valley (V7) based on digital-to-analog (DAC) converted voltage values, also referred to as DACs. Each DAC can represent a certain number of millivolts (mV), here about 10 mV by way of example.

A newly created block family can be associated with bin 0, and each subsequently created block family can be associated with a sequentially numbered block family. Then, the memory sub-system controller can periodically perform a calibration process in order to associate each die of every block family with one of the predefined threshold voltage offset bins (e.g., bins 0-7 in the illustrative example of FIG. 3), which is in turn associated with the voltage offset to be applied for read operations. The associations of pages, blocks, and/or partitions with block families and block families and dies with threshold voltage offset bins can be stored in respective metadata tables maintained by the memory sub-system controller 115.

Figure 4A:
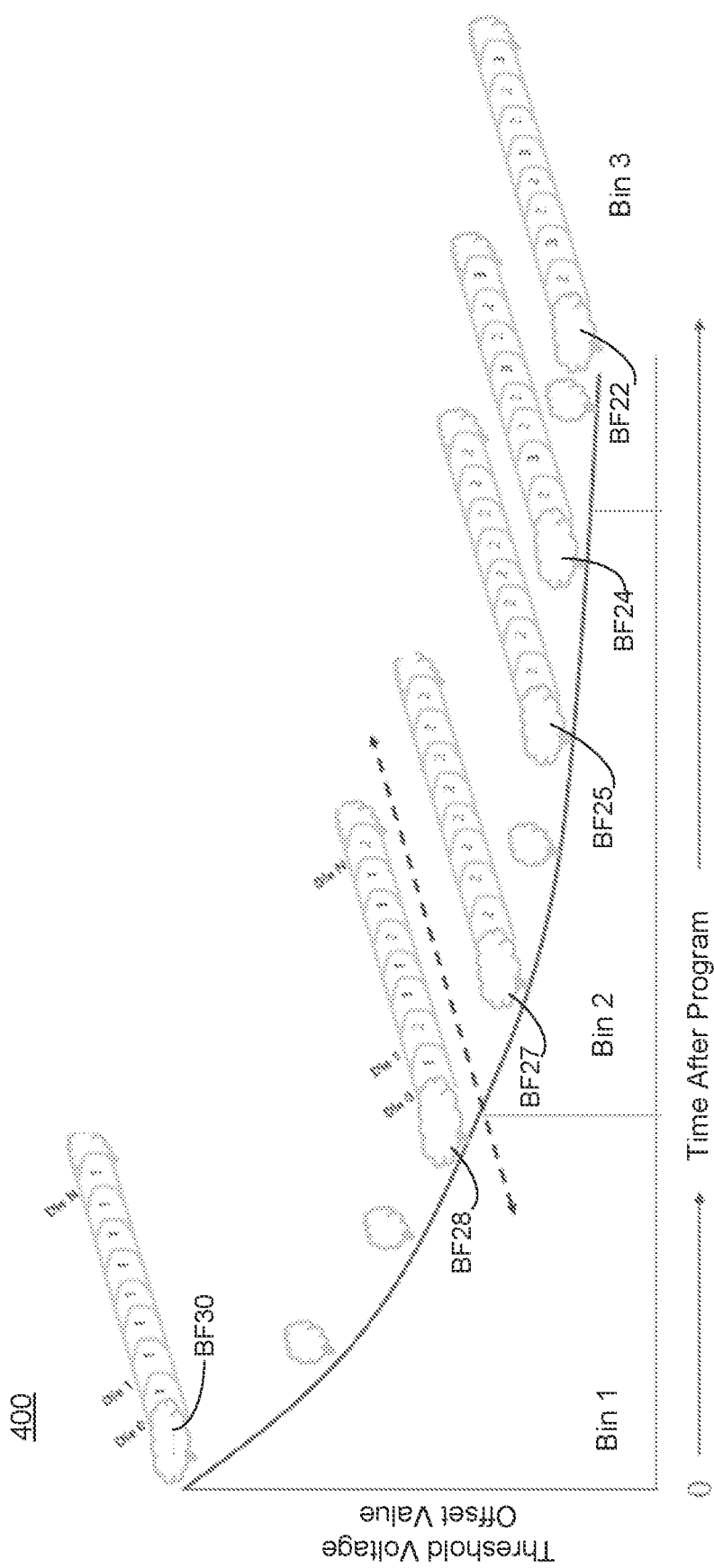
FIG. 4A is a graph illustrating how block families exist in a particular threshold voltage offset bin, which depends on time after program (TAP) in accordance to an embodiment.
Figure 4B:
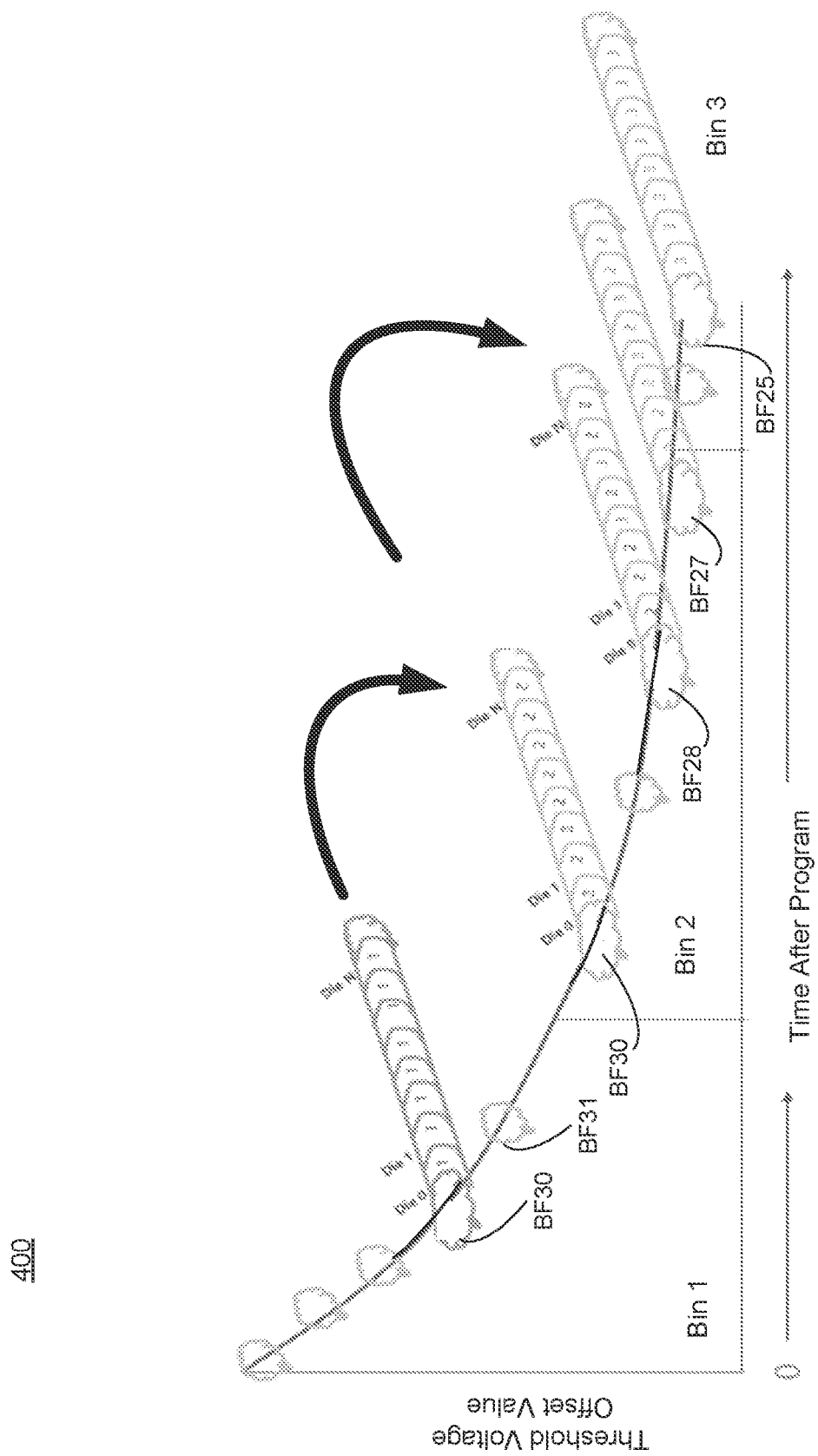
FIG. 4B is a graph illustrating how block families move to the right with increasing time after program (TAP) in accordance with an embodiment.

FIG. 4A is a graph 400 illustrating how block families exist in a particular threshold voltage offset bin, which depends on time after program (TAP) in accordance to an embodiment. FIG. 4B is the graph 400 illustrating how block families change their respective voltage offset bins with increasing time after program (TAP) in accordance with an embodiment. In the example embodiment of FIG. 4A, block families (BFs) are created in the first threshold voltage offset bin (Bin 1 for short), and age over time to transition to being associated with a subsequent threshold voltage offset bin. The drift in TVS (which is along the Y axis in the graph 400) starts more quickly with respect to TAP and thus has a steeper curve at first and slows down later, leveling out this curve.

As illustrated in FIG. 4A, BF28 is identified as the oldest (i.e., the least recently created) block family in Bin 1 because at least a part of the data in BF28 is still within the time after program (TAP) defined by Bin 1. Further, BF30 has just been created (e.g., closed as a BF) and is the youngest (i.e., the most recently created) block family in Bin 1. Similarly, BF27 is identified as the youngest block family in the second threshold voltage offset bin (Bin 2) and BF24 as the oldest block family in Bin 2. Further, BF22 is old enough to reside now in the third threshold voltage offset bin (Bin 3). While many threshold voltage offset bins can exist, the embodiment of FIG. 4A illustrates three bins solely for purposes of explanation, each of which is associated with one or more threshold voltage offset values.

As is evidenced in FIG. 4B, the block families generally drift in threshold voltage offset over time, where BF28 and BF30 are both now in Bin 2, BF25 is in Bin 3, and new block families BF31 and younger BFs are located in Bin 1. Due to the fact that block families are drifting over time with respect to the threshold voltage offset value, the controller can perform a scan of the memory cells of the memory device (e.g., to measure TVS levels) and a resynchronization of pointers of the block families based on the measured TVS levels. The scan can be referred to as a block family scan, or BF scan. The scan can involve performing, with respect to a specified number of randomly selected blocks within the block family that is being scanned, read operations utilizing different threshold voltage offsets to select the threshold voltage offset that minimizes the error rate of the read operation. The scanning can be limited to the block families that exist at the boundaries between threshold voltage offset bins (e.g., BF24 and BF28 as viewed in FIG. 4A) and are thus anticipated to be the first to move into a new bin. Depending on frequency of scanning, one or more BFs that have recently transitioned into new bins can also be measured and their bin pointers resynchronized. A calibration process can be periodically performed to resynchronize the bin pointers. "Calibration" herein shall refer to altering a read level value (possibly by adjusting a read level offset or read level base) to better match the ideal read levels for a read or set of reads. Resynchronization of pointers refers to updating pointers between metadata tables that tell the controller 115 which threshold voltage offset bin to use for which block families and thus, ultimately, which threshold voltage offset values to apply for which block families.

Figure 4C:
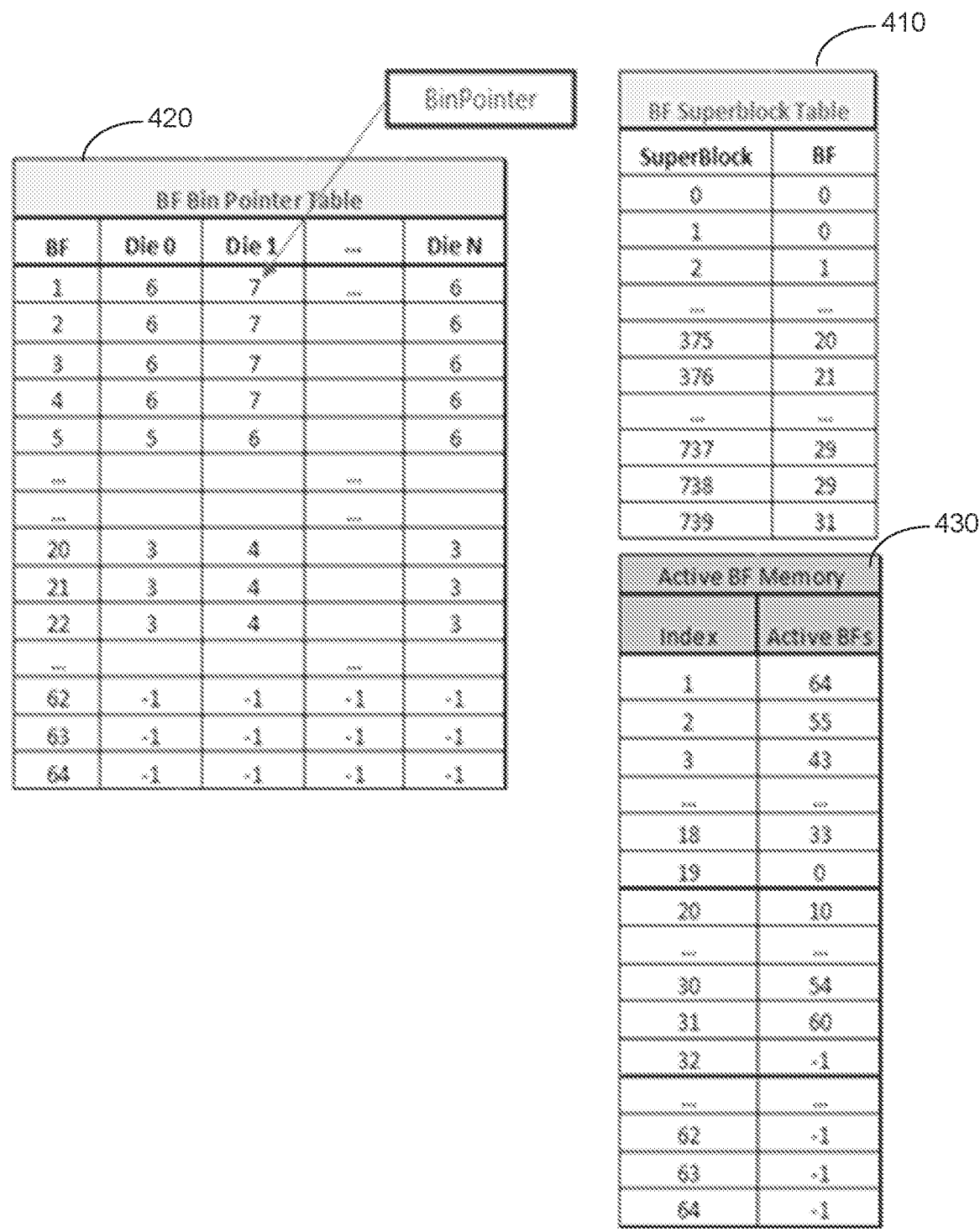
FIG. 4C schematically illustrates example metadata maintained by the memory sub-system controller for associating blocks with block families, in accordance with embodiments of the present disclosure.

FIG. 4C schematically illustrates example metadata maintained by the memory sub-system controller for associating blocks with block families, in accordance with embodiments of the present disclosure. As schematically illustrated by FIG. 4C, the memory sub-system controller can maintain the BF superblock table 410, the BF bin pointer table 420, and the active BF memory table 430.

Each record of the BF superblock table 410 specifies the block family (BF) associated with the specified superblock. In some implementations, the superblock table records can further include time and temperature values associated with the specified superblock.

The BF bin pointer table 420 is indexed by the BF number, such that each record of the table 420 specifies, for the block family referenced by the BF number of the record, a set of threshold voltage offset bins associated with respective dies of the block family. In other words, each record of the table 420 includes a vector, each element of which specifies the threshold voltage offset bin associated with the die referenced by the index of the vector element. An element in the record in the table 420 is referred to as a bin pointer. The threshold voltage offset bins to be associated with the block family dies can be determined by the calibration process, as described in more detail herein below. In the example of FIG. 4C, the "−1" value for a bin pointer is shown to represent BF numbers that do not exist yet.

Finally, the active BF memory table 430 is indexed by an index number of the record in the table. Each record of the table 430 specifies an active BF for the corresponding index. The table 430 specifies active BFs in the implied BF creation order, from youngest (e.g., latest) to oldest (e.g., earliest). The example in FIG. 4C shows that there can be up to 64 active BFs at a time.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the BF superblock table 410 is used to identify the block family identifier corresponding to the physical block number; then, the block family identifier is used as the index to the BF bin pointer table 420 in order to determine the threshold voltage offset bin pointer associated with the block family and the die; finally, the identified threshold voltage offset bin pointer is used as an index to an offset table (not shown) in order to determine the threshold voltage offset corresponding to the bin pointer. The memory sub-system controller can then additively apply the identified threshold voltage offset to the base voltage read level in order to perform the requested read operation.

In the illustrative example of FIG. 4C, the superblock table 410 maps superblock 2 to BF 1, which is utilized in the BF bin pointer table 420 in order to determine that die 1 is mapped to bin pointer 7 for BF 1. The value for bin pointer 7 can be used as an index to an offset table (not shown) in order to determine the threshold voltage offset values for bin pointer 7.

Figure 5:
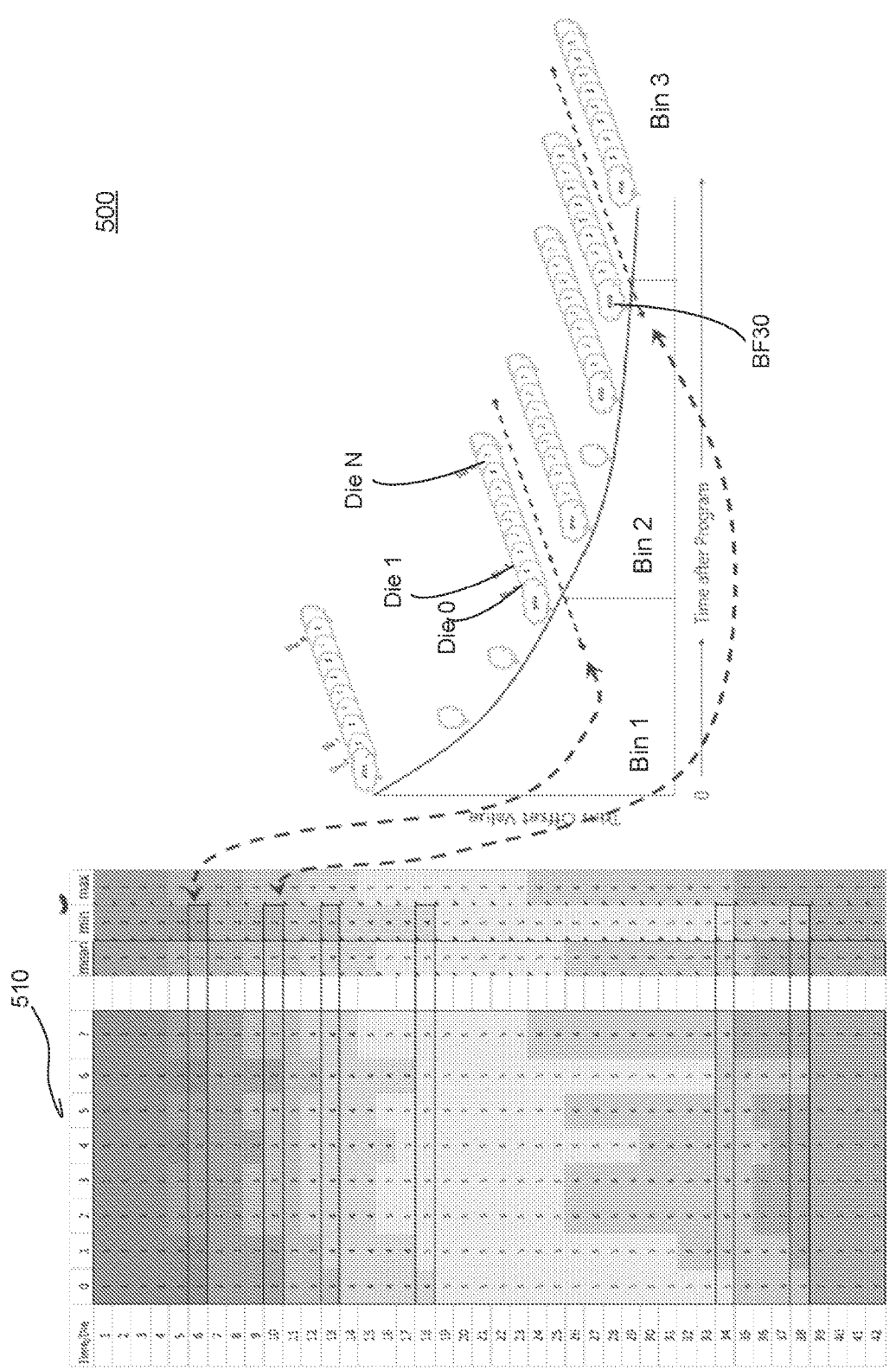
FIG. 5 is a graph illustrating how the threshold voltage offset bins of one block family change with increasing time after program (TAP) in accordance with an embodiment.

FIG. 5 is an example graph 500 illustrating how the threshold voltage offset bins of one block family (e.g., BF30) change with increasing time after program (TAP) in accordance with an embodiment. In the example embodiment of FIG. 5, table 510 shows bin pointers for a single example block family BF30 across multiple die of the block family over a period of time corresponding to the increasing TAP shown in graph 500. While the illustrative example of FIG. 5 shows 8 die, die 0 through die 7, across a sample of 42 time instances, various other number of die and time instances exist for which bin pointer values can be tracked. When a BF is created, such as, at the time instance corresponding to time 1 in table 510, all die are populated with the same initial bin pointer (e.g., bin pointer 1 as shown in FIG. 5). As BF scan runs over time at different time instance corresponding to TAP, the block family memory is updated and a die can deviate from the bin pointer at the previous time instance. The rate of deviation can be different for different die. That is, the bin pointers can vary across the multiple die in the block family. Various factors can contribute to the variance, such as location of the die (e.g., die closer to the controller heater can experience relatively faster temperature increase), material used, endurance (e.g., how often the die is written to), etc. Due to this variance, when it is time to perform a BF scan for a particular BF, the scan is performed on each die of the block family.

After a period of time has elapsed, a pattern can occur, indicating that some die behave similarly to other die in the block family in terms of slow charge loss. The die that behave similarly at a particular instance of TAP exhibit similar rate of slow charge loss. For example, at time 6 on table 510, die 0, 1, and 6 have not moved over from bin 1 to bin 2 yet, whereas the rest of the die moved over to bin 2. Die 0, 1, and 6 thus appears to be slow in the rate of slow charge loss at this particular time instance. Accordingly, the die that behave similarly can be grouped together to form a die family. As a result, rather than scanning every die of every block family when appropriate, a representative die can be scanned to identify the modified bin pointer at a time instance and the bin pointers for all the other die of the die family can be modified using the modified bin pointer of the representative die. Thus, by grouping the similarly behaved die in die families, the extra burden on resources needed to perform BF scans can be reduced, e.g., the controller no longer has to always scan every die of every BF to update the metadata table pointers.

Figure 6:
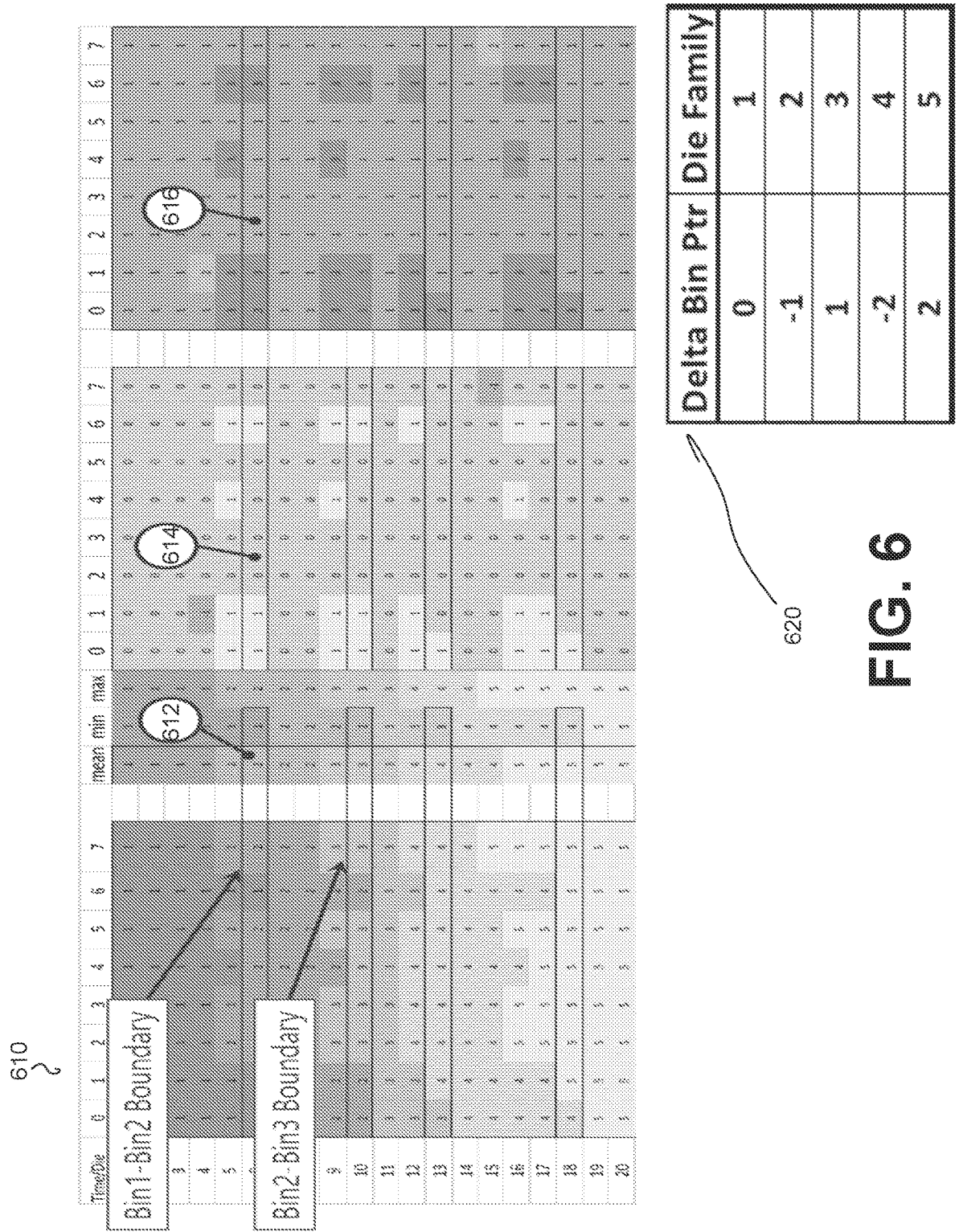
FIG. 6 schematically illustrates example computation of measures for associating die to die families, in accordance with embodiments of the disclosure.

FIG. 6 schematically illustrates example computation of measures for associating die to die families, in accordance with embodiments of the disclosure. The die that behave similarly to other die in the block family in terms of slow charge loss can share one or more similar characteristics. For example, slow charge loss (SCL) itself is a characteristics shared by the die in the same die family, in that all die in the die family experience the same rate of SCL for a particular time after program (TAP). In other examples, a die in a die family can share various other characteristics, such as, read disturb, data integrity, endurance, operational temperature, dynamic wear, or static wear, with other die in the die family. A measure which quantifies the characteristics associated with the die can be obtained. The measure can be used to group one or more die in a particular die family. In some examples, the measure can be associated with various data state metrics, as discussed previously. In some examples, the measure can be associated with a temporal voltage shift (TVS), a voltage offset, a threshold voltage offset bin, a raw bit error rate (RBER), a rate of slow charge loss, or a combination thereof. In some examples, the measure can be the value that quantifies the characteristic (e.g., an RBER), wherein in other examples, the measure can be a calculation performed on the value that quantified the characteristic (e.g., a relative RBER of the die as compared to another die). In one example, the die family is grouped using a certain set of die at a particular TAP.

Die family manager component 113 can obtain a measure associated with a characteristic of a die of a memory device. In the illustrative example of FIG. 6, die families are grouped based on the characteristic of SCL, such that die having similar rate of SCL are grouped together. The measure associated with the characteristic of SCL used here is related to a threshold voltage offset bin. The measure used here is a relative bin pointer value for a die compared to a mean bin pointer value across the die of the block family. Table 610 lists a plurality of die (e.g., die 0 to die 7) over time instances corresponding to TAP (e.g., time 1 through time 20) with a bin pointer (e.g., bin 1, bin 2, etc.) for each time for each die. In an example, die family manager component 113 can obtain the measure by performing calculations dynamically to determine the relative bin pointer value. In another example, the die family manager component 113 can obtain the measure by obtaining the data that has been calculated previously and/or stored in a memory.

In one embodiment, in order to obtain the measure, the die family manager component 113 can identify (e.g., read) a particular threshold voltage offset bin pointer (e.g., 2) for a particular die (e.g., die 2) at a particular TAP instance (e.g., time 6) from table 610. The die family manager component 113 can compute a mean threshold voltage offset bin 612 (e.g., 2) for the block family across the plurality of die (e.g., die 0-die 7) of the block family. That is, the mean bin pointer value is calculated based on the bin pointer values of each of die 0 through die 7. The mean bin pointer value can represent a nominal bin value. A nominal bin value represents the bin value for the majority of the die in the block family. In an example, the mean bin pointer value can be a decimal number. In an example, the decimal number can be rounded to the closest integer value. The "mean" column in table 610 lists mean bin pointer for all the die of the block family over a period of time. The "min" column lists the minimum value of the bin pointers across all the die corresponding to a TAP instance, which also corresponds to the bin that the block family is in at that TAP instance. Die family manager component 113 can calculate a difference 614 (e.g., 0) between the particular threshold voltage offset bin (e.g., 2) for die 2 and the mean threshold voltage offset bin (e.g., 2) across die 0 to die 7. The die family manager component 113 can use this difference as the measure to group the die into a die family.

In an embodiment, the die family manager component 113 can determine whether the obtained measure satisfies a criterion used to group die into a die family and if it is determined that the measure satisfies the criterion, the die family manager component 113 associates the die with the die family. In an example, the die is associated with a die family using a mapping table. For example, table 620 depicts a mapping between die families and delta bin pointers (e.g., difference between the bin pointer of the die to the mean bin pointer across all die of the BF). The table can include a predetermined set of values (e.g., a particular value, a range of values, etc.) for the delta bin pointer that correspond to a die family. For example, a difference value of 0 for the delta bin pointer is mapped to a die family 1 (DF1). In an example, the measure satisfies a particular criterion when the measure is within a particular set of values associated with the particular die family. In an example, die family association can vary by TAP value. Thus, a measure can satisfy a criterion at one TAP instance, whereas it is possible that the measure does not satisfy the same criterion at a different TAP instance.

Figure 7:
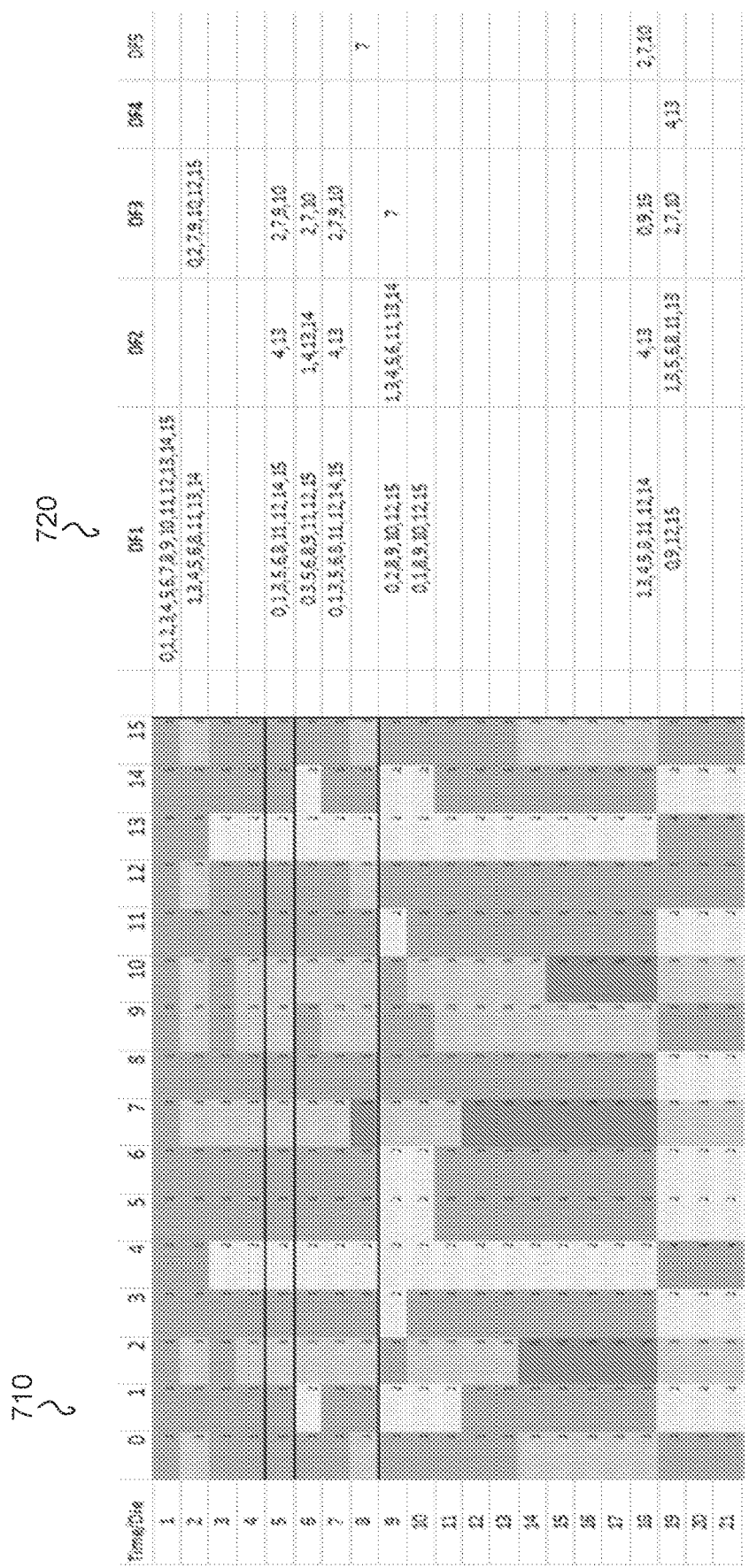
FIG. 7 schematically illustrates assignment of die to die families, in accordance with embodiments of the disclosure.

FIG. 7 schematically illustrates assignment of die to die families, in accordance with embodiments of the disclosure. In the example, table 710 shows assignment of die 0 through die 15 to different die families (e.g., DF1, DF2, etc.) over a time period corresponding to TAP time instances 1 through 21. In some embodiments, die family manager component 113 can associate each die of a subset of a plurality of die of a block family to a die family based on respective measures for each die of the subset satisfying a criterion associated with the die family. For example, table 720 shows each die of a subset of die (e.g., die 2, die 7, and die 10) of a plurality of die (e.g., die 0 through die 15) is associated to a die family (e.g., DF3) at time 6. Each die is associated with a die family based on a measure for the die satisfying the criterion for that die family, as described in FIG. 6. In an example, a metadata can be used to associate a die to a die family.

In an embodiment, if it is determined that the measure for a particular die (e.g., die 4) does not satisfy a criterion (e.g., delta bin pointer value being 0) associated with a die family (e.g., DF1) at a particular TAP (e.g., time 5), the die family manager component 113 can determine whether the measure satisfies another criterion (e.g., delta bin pointer value being −1) associated with another die family (e.g., DF2). Rif it is determined that the measure satisfies the other criterion associated with the other die family, the die family manager component 113 can associate the die with the other die family (e.g., die 4 is associated with DF2 upon the delta bin pointer value for die 4 satisfying the predetermined value −1 for DF2). The die family manager component 113 can continue to determine whether the measure satisfies any of the criteria associated with any of the various die families of the memory device and upon one of the criterion being satisfied, the die family manager component 113 can associate the die to the corresponding die family.

In an embodiment, the die family manager component 113 can perform a learning process to determine how to group the die families by associating a die to die families over a sample period of time corresponding to various TAP values. In some embodiments, the learning process for the die family formation can be performed during a pre-characterization operation. In some embodiments, the pre-characterization operation (e.g., prior to releasing the memory sub-system 110 into the field) can be performed by die family manager component 113 executing at host system 120 or memory sub-system 110. In some embodiments, the die families can be formed (or re-formed) based on characterization on board the memory sub-system 110. In some embodiments, the characterization on board the memory sub-system 110 can be performed dynamically (e.g., in the field), such as responsive to the satisfaction of a various triggering events. In various examples, the triggering event can be associated with the endurance parameter of the die in the memory device indicating how often the die is written when on board the memory sub-system 110, a number of program-erase (PE) cycles of the memory device 130 (or memory sub-system 110) meeting or exceeding a threshold number of PE cycles, a measure indicating that a die is in recovery mode more than a threshold number of time as a result of the die being associated with the wrong die family, etc. Additional triggering events not explicitly described herein can also cause the dynamic on board formation of die families.

The association of the die to die families can be utilized during performance of a calibration process for a block family. The memory sub-system controller can periodically perform a calibration process in order to associate each die of every block family with one of the predefined threshold voltage offset bins, which is in turn associated with the voltage offset to be applied for read operations. The calibration process involves performing a block family scan (BF scan). The BF scan involves performing, with respect to a specified number of randomly selected blocks within the block family that is being calibrated, read operations utilizing different threshold voltage offsets for a representative die for each die family, and choosing the threshold voltage offset that minimizes the error rate of the read operation. Upon choosing the threshold voltage offset based on the representative die, the block family is calibrated by associating the threshold voltage offset with each die of the die family, without performing the BF scan on every die of the die family. The associations of blocks with block families and block families and dies with threshold voltage offset bins can be stored in respective metadata tables maintained by the memory sub-system controller.

In an embodiment, the memory sub-system controller programs one or more blocks at a memory device. The one or more blocks are associated with a block family and with a plurality of die. The memory sub-system controller associates the block family with a first threshold voltage offset bin for each of the plurality of die. Responsive to detecting a triggering event, the memory sub-system controller selects a second threshold voltage offset bin for calibrating the block family based on a first die of the plurality of die. The first die is associated with a first die family. In one example, selecting the second threshold voltage offset bin for calibrating the block family based on a BF scan, which involves performing read operations on randomly selected blocks of the first die utilizing a plurality of threshold voltage offset values, and selecting one of the plurality of threshold voltage offset values as the second threshold voltage offset bin. Performing the BF scan is limited to the first die, instead of each die of the die family, as all die within the same die family exhibit the same threshold voltage shift. The memory sub-system controller then performs the calibration by associating the block family with the second threshold voltage offset bin for each of a first subset of die of the plurality of die. The first subset of die is associated with the first die family. Additionally, the memory sub-system controller can select a third threshold voltage offset bin based on scanning a second die that is associated with a second die family and associate the block family with the third threshold voltage offset bin for each of a second subset of die associated with the second die family. In an embodiment, at each successive BF scan (e.g., at a successive TAP instance), a different die from the die family is scanned as the representative die. In an example, the die in the die family are scanned sequentially at each successive BF scan. For example, if die 0, 3, 7, and 15 are in DF1, first die 0 is scanned at a first BF scan interval. On the next BF Scan interval, die 3 is scanned. On the next BF Scan interval, die 7 is scanned, and so on. Thus, associating a group of die to a die family reduces the number of BF scan needed to perform the calibration process.

In some embodiments, the calibration process can be performed responsive to a triggering event corresponding to a counter. For example, each time a block family is programmed a counter can be initialized. The values of the counter can indicated the amount of time data that has elapsed since the data was last programmed to the respective block family. In some embodiments, a calibration process can be performed responsive to determining that the counter meets or exceeds a threshold value. For example, when the counter indicates that 10 hours has elapsed since the block family was last programmed, a calibration process can be initiated. In some embodiments, the triggering event corresponding to the counter can be a power down event that clears the counter. A power down event can include any event that clears the counter such the counter no longer can be used to accurately estimate the time that has elapsed since the corresponding block family was last programmed. Examples of a power down event can include a full shut down of the power system or a sleep power cycle that prevents the counter from performing a counting function.

In operation, upon receiving a read command, the memory sub-system controller can identify the block family associated with the block identified by the logical block address (LBA) specified by the read command, identify the threshold voltage offset bin associated with the block family and die on which the block resides, compute the new threshold voltage by additively applying the threshold voltage offset associated with the threshold voltage offset bin to the base read level, and perform the read operation using the new threshold voltage, as described in more detail herein below.

Figure 8:
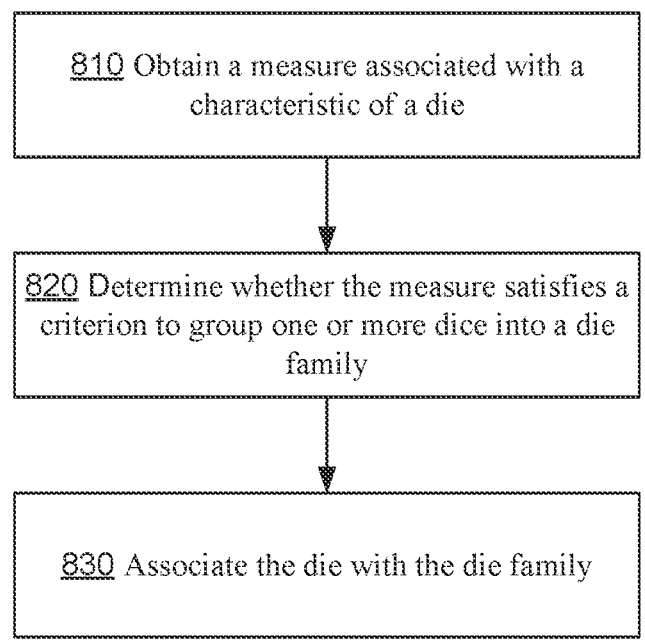
FIG. 8 is a flow diagram of an example method of associating a die with a die family, in accordance with some embodiments of the disclosure.

FIG. 8 is a flow diagram of an example method of associating a die with a die family, in accordance with some embodiments of the disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the die family manager component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 810, the processing logic of the memory sub-system controller obtains a measure associated with a characteristic of a die of a memory device. In some examples, the characteristic of the die can include one or more of a slow charge loss (SCL), read disturb, data integrity, endurance, operational temperature, dynamic wear, or static wear. In some examples, the measure can be associated with one or more of a temporal voltage shift, voltage offset, threshold voltage offset bin, bit error rate, or rate of slow charge loss. In one embodiment, a measure can be obtained by performing the steps of: identifying a particular threshold voltage offset bin for the die associated with a block family at a particular time after programming data on the die, computing a mean threshold voltage offset bin for the block family across a plurality of die of the block family, and calculating a difference between the particular threshold voltage offset bin and the mean threshold voltage offset bin as the measure.

At operation 820, the processing logic of the memory sub-system controller determines whether the measure satisfies a criterion to group one or more die into a die family. In an example, a first criterion can be used to group the die into a first die family.

Responsive to determining, at operation 830, that the measure satisfies the criterion, the processing logic associates the die with the die family. In an example, the measure satisfies a first criterion when the measure is within a first set of values associated with the first die family. In an example, determining that the measure satisfies the first criterion includes determining that the measure satisfies the first criterion at a particular time after programming a cell residing on the die.

Furthermore, in some embodiments, the processing logic can associate each die of a first subset of a plurality of die of a block family to the first die family, such that a respective measure associated with the characteristic of each die of the first subset satisfies the first criterion associated with the first die family.

Additionally, in some examples, responsive to determining that the measure does not satisfy the first criterion, the processing logic can determine whether the measure satisfies a second criterion associated with a second die family. Respective to determining that the measure satisfies the second criterion associated with the second die family, the processing logic can associate the die with the second die family. Similarly, the processing logic can continue to determine whether the measure satisfies any of the criteria associated with the various die families of the memory device and upon one of the criterion being satisfied, the processing logic can associate the die to the corresponding die family.

In an embodiment, responsive to detecting a triggering event, the processing logic can calibrate a block family associated with the die by associating the block family with a voltage offset bin for each die associated with the first die family.

FIG. 9 is a flow diagram of an example method of threshold voltage offset bin selection based on die family, in accordance with some embodiments of the disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the die family manager component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 910, the processing logic of the memory sub-system controller programs one or more blocks at a memory device. The one or more blocks are associated with a block family and with a plurality of die.

At operation 920, the processing logic associates the block family with a first threshold voltage offset bin for each of the plurality of die.

Responsive to detecting a triggering event, at operation 930, the processing logic selects, for calibrating the block family, a second threshold voltage offset bin based on a first die of the plurality of die. The first die is associated with a first die family. In one example, selecting the second threshold voltage offset bin for calibrating the block family based on the first die includes the steps of: performing read operations on randomly selected blocks of the first die utilizing a plurality of threshold voltage offset values, and selecting one of the plurality of threshold voltage offset values as the second threshold voltage offset bin. In an embodiment, the first die is associated with the first die family based on a first measure associated with a characteristic of the first die satisfying a first criterion to group one or more die into the first die family.

At operation 940, the processing logic calibrates the block family. In one example, the calibration is performed by associating the block family with the second threshold voltage offset bin for each of a first subset of die of the plurality of die. The first subset of die is associated with the first die family. In an example, the first die and the first subset of die is associated with the first die family at a particular time after programming a cell residing on the first die.

Furthermore, responsive to detecting the triggering event, the processing logic selects a third threshold voltage offset bin for calibrating the block family based on a second die of the plurality of die. The second die is associated with a second die family. The processing logic then calibrates the block family by associating the block family with the third threshold voltage offset bin for each of a second subset of die of the plurality of die, wherein the second subset of die is associated with the second die family. In an embodiment, the second die is associated with the second die family based on a second measure associated with the characteristic of the second die satisfying a second criterion to group one or more die into the second die family.

Figure 10:
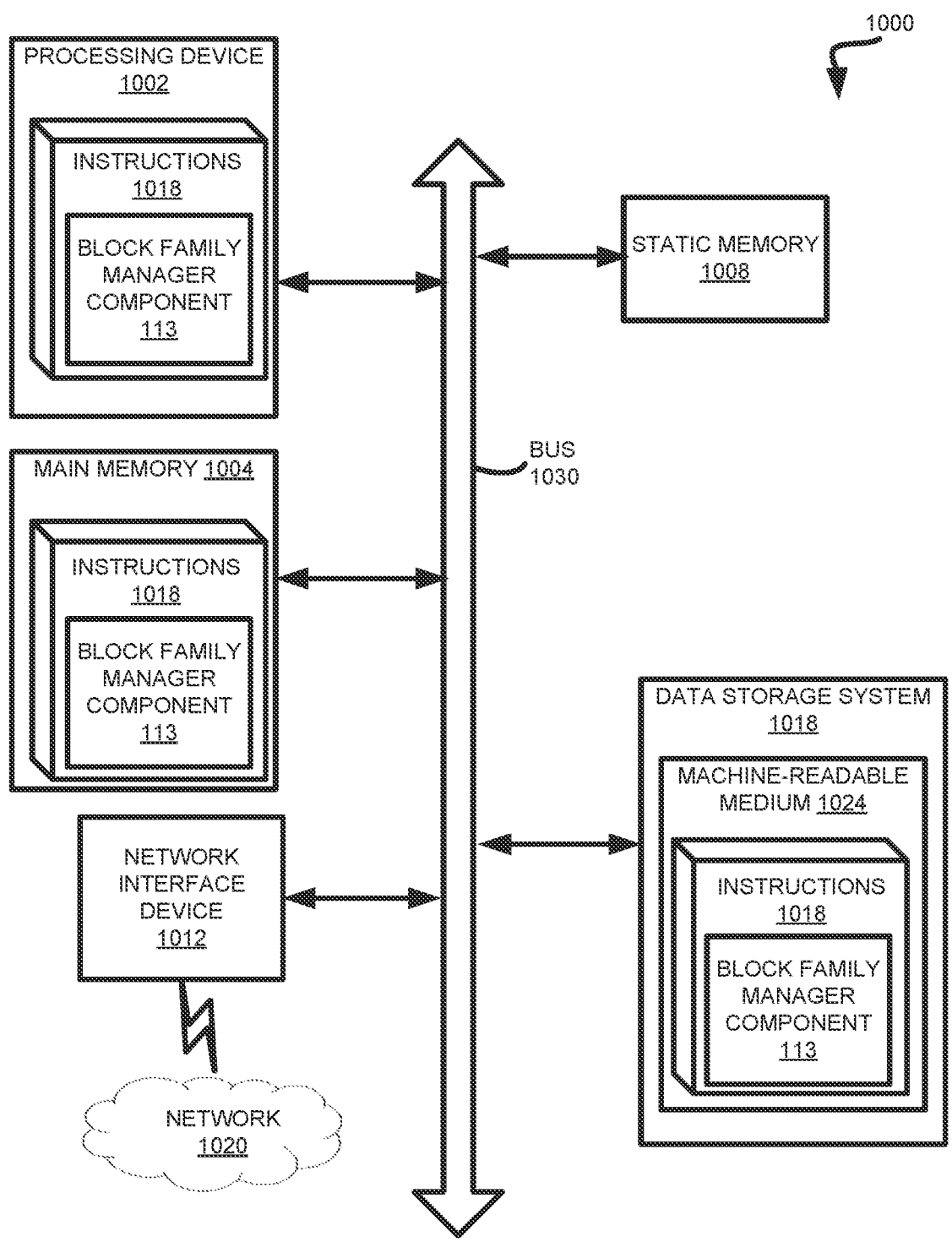
FIG. 10 is a block diagram of an example computer system in which embodiments of the disclosure can operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1 or 2) that includes, is coupled to, or utilizes a memory sub-system (e.g., the memory sub-system 110 of FIG. 1 or 2) or can be used to perform the operations of a controller (e.g., to execute an operating system to perform operations corresponding to the die family manager component 113 of FIG. 1 or 2). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 810 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1028 for performing the operations and steps discussed herein. The computer system 1000 can further include a network interface device 1012 to communicate over the network 1020.

The data storage system 1018 can include a machine-readable storage medium 1024 (also known as a computer-readable medium) on which is stored one or more sets of instructions 1028 or software embodying any one or more of the methodologies or functions described herein. The instructions 1028 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory sub-system 110 of FIG. 1 or 2.

In one embodiment, the instructions 1028 include instructions to implement functionality corresponding to the die family manager component 113 of FIG. 1 or 2. While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an implementation" or "one implementation" or the like throughout may or may not mean the same embodiment or implementation. One or more embodiments or implementations described herein may be combined in a particular embodiment or implementation. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
associating, by a processing device, a set of dies of a block family with a die family, wherein the block family is associated with a first threshold voltage offset bin for voltage offsets to be applied in a read operation; and
responsive to detecting a triggering event, associating each die of the set of dies with a second threshold voltage offset bin for voltage offsets to be applied in a read operation, wherein the second threshold voltage offset bin is selected based on a representative die of the set of dies associated with the die family.

2. The method of claim 1, wherein each die of the set of dies associated with the die family has a characteristic satisfying a first criterion.

3. The method of claim 2, wherein the characteristic comprises one or more of: a slow charge loss (SCL), read disturb, data integrity, endurance, operational temperature, dynamic wear, or static wear.

4. The method of claim 2, wherein a measure associated with the characteristic comprises one or more of: a temporal voltage shift, voltage offset, threshold voltage offset bin, bit error rate, or rate of slow charge loss.

5. The method of claim 4, wherein the characteristic satisfying the first criterion comprises the measure being within a first set of values associated with the die family.

6. The method of claim 1, wherein associating the set of dies of the block family with the die family is performed at a particular time after program.

7. The method of claim 1, wherein the triggering event comprises one or more of: a value of a counter exceeding a threshold value, or a power down event.

8. The method of claim 1, further comprising: to associate each die of the set of dies with the second threshold voltage offset bin, performing a block family scan periodically.

9. The method of claim 8, wherein performing the block family scan comprises:
performing read operations on randomly selected blocks of the representative die utilizing a plurality of threshold voltage offset values, and
selecting one of the plurality of threshold voltage offset values as the second threshold voltage offset bin.

10. A system comprising:
a memory device; and
a processing device, operatively coupled to the memory device, to perform operations comprising:
associating a set of dies of a block family with a die family,
wherein the block family is associated with a first threshold voltage offset bin for voltage offsets to be applied in a read operation; and
responsive to detecting a triggering event, associating each die of the set of dies with a second threshold voltage offset bin for voltage offsets to be applied in a read operation, wherein the second threshold voltage offset bin is selected based on a representative die of the set of dies associated with the die family.

11. The system of claim 10, wherein each die of the set of dies associated with the die family has a characteristic satisfying a first criterion.

12. The system of claim 11, wherein the characteristic comprises one or more of: a slow charge loss (SCL), read disturb, data integrity, endurance, operational temperature, dynamic wear, or static wear.

13. The system of claim 11, wherein a measure associated with the characteristic comprises one or more of: a temporal voltage shift, voltage offset, threshold voltage offset bin, bit error rate, or rate of slow charge loss.

14. The system of claim 13, wherein the characteristic satisfying the first criterion comprises the measure being within a first set of values associated with the die family.

15. The system of claim 10, wherein associating the set of dies of the block family with the die family is performed at a particular time after program.

16. The system of claim 10, wherein the triggering event comprises one or more of: a value of a counter exceeding a threshold value, or a power down event.

17. The system of claim 10, wherein the operations further comprise:
to associate each die of the set of dies with the second threshold voltage offset bin, performing a block family scan periodically.

18. The system of claim 17, wherein performing the block family scan comprises:
performing read operations on randomly selected blocks of the representative die utilizing a plurality of threshold voltage offset values, and
selecting one of the plurality of threshold voltage offset values as the second threshold voltage offset bin.

19. A non-transitory computer-readable medium comprising instruction that, responsive to execution by a processing device, cause the processing device to perform operations comprising:
associating, by the processing device, a set of dies of a block family with a die family, wherein the block family is associated with a first threshold voltage offset bin for voltage offsets to be applied in a read operation; and
responsive to detecting a triggering event, associating each die of the set of dies with a second threshold voltage offset bin for voltage offsets to be applied in a read operation, wherein the second threshold voltage offset bin is selected based on a representative die of the set of dies associated with the die family.

20. The non-transitory computer-readable medium of claim 19, wherein each die of the set of dies associated with the die family has a characteristic satisfying a first criterion.

* * * * *